United States Patent
Griph et al.

(10) Patent No.: US 6,674,808 B1
(45) Date of Patent: Jan. 6, 2004

(54) POST-AMPLIFIER FILTER REJECTION EQUALIZATION

(75) Inventors: Richard Steven Griph, Mesa, AZ (US); Albert Howard Higashi, Lawrenceville, GA (US)

(73) Assignee: General Dynamics Decision Systems, Inc., Scottsdale, AZ (US)

(*) Notice: Subject to any disclaimer, the term of this patent is extended or adjusted under 35 U.S.C. 154(b) by 0 days.

(21) Appl. No.: 09/473,349

(22) Filed: Dec. 28, 1999

(51) Int. Cl.[7] .......................... H04B 15/00; H04N 5/21
(52) U.S. Cl. ........................ 375/285; 333/149
(58) Field of Search ......................... 375/285, 296, 375/297, 298, 220; 455/20

(56) References Cited

U.S. PATENT DOCUMENTS

| | | | |
|---|---|---|---|
| 4,291,277 A | 9/1981 | Davis et al. | |
| 4,564,952 A | 1/1986 | Karabinis et al. | |
| 4,580,105 A | 4/1986 | Myer | |
| 5,113,414 A | 5/1992 | Karam et al. | |
| 5,172,068 A | 12/1992 | Childs | |
| 5,404,378 A | 4/1995 | Kimura | |
| 5,448,206 A * | 9/1995 | Newhall | 332/103 |
| 5,486,789 A | 1/1996 | Palandech et al. | |
| 5,576,660 A | 11/1996 | Pouysegur et al. | |
| 5,696,794 A | 12/1997 | O'Dea | |
| 5,732,333 A * | 3/1998 | Cox et al. | 455/126 |
| 5,778,029 A | 7/1998 | Kaufmann | |
| 5,838,195 A | 11/1998 | Szmurlo et al. | |
| 5,910,965 A * | 6/1999 | Ierfino et al. | 375/220 |
| 5,923,712 A | 7/1999 | Leyendecker et al. | 375/297 |
| 6,029,285 A * | 2/2000 | Belcher et al. | 330/149 |
| 6,285,412 B1 * | 9/2001 | Twitchell | 348/608 |
| 6,298,097 B1 * | 10/2001 | Shalom | 375/297 |
| 6,337,599 B2 * | 1/2002 | Lee | 330/149 |

OTHER PUBLICATIONS

Kang H W et al: "An Efficient Adaptive Predistorter for NonLinear High Power Amplifier in Satellite Communication", IEEE International Symposium on Circuits and Systems, US, New York, NY: IEEE, Jun. 9, 1997, pp. 2288–2291, XP000804798 ISBN: 0–7803–3584–8.

Lazzarin G et al: "Nonlinearity Compensation in Digital Radio Systems", IEEE Transactions on Communications, US. IEEE, Inc. New York, vol. 42, No. 2/03/04, Feb. 1, 1994, pp. 988–999, XP000447349, ISSN: 0090–6778.

Kang H W et al.: "On Compensating Nonlinear Distortions of an OFDM System using an Efficient Adaptive Predistorter", IEEE Transactions on Communications, US, IEEE Inc., New York, vol. 47, No. 4, Apr. 1999, pp. 522–526, XP000860507, ISSN: 0090–6778.

Karam G et al: "Implementation and Performance of Data Predistortion with Memory in Digital MIcrowave Radio" Proceedings of the Global Telecommunications Conference and Exhibition (Globecom), US, New York, IEEE, vol. –, Nov. 27, 1989, pp. 400–405, XP000091135.

* cited by examiner

*Primary Examiner*—Stephen Chin
*Assistant Examiner*—Lawrence Williams
(74) *Attorney, Agent, or Firm*—Jenner & Block, LLC

(57) ABSTRACT

A post-HPA filter rejection equalizer system and method locally equalizes post-HPA filtering. A predistorter (20) uses a phase error to control the predistortion, and an equalizer (46) uses a magnitude error to control the equalization. The equalizer samples the HPA output multiple occurrences in a burst fashion. The equalized signal is then used to determine phase and magnitude errors. The phase errors (54) are used to update the predistorter (20), and the magnitude errors (52) are used to update the analytic equalizer.

8 Claims, 1 Drawing Sheet

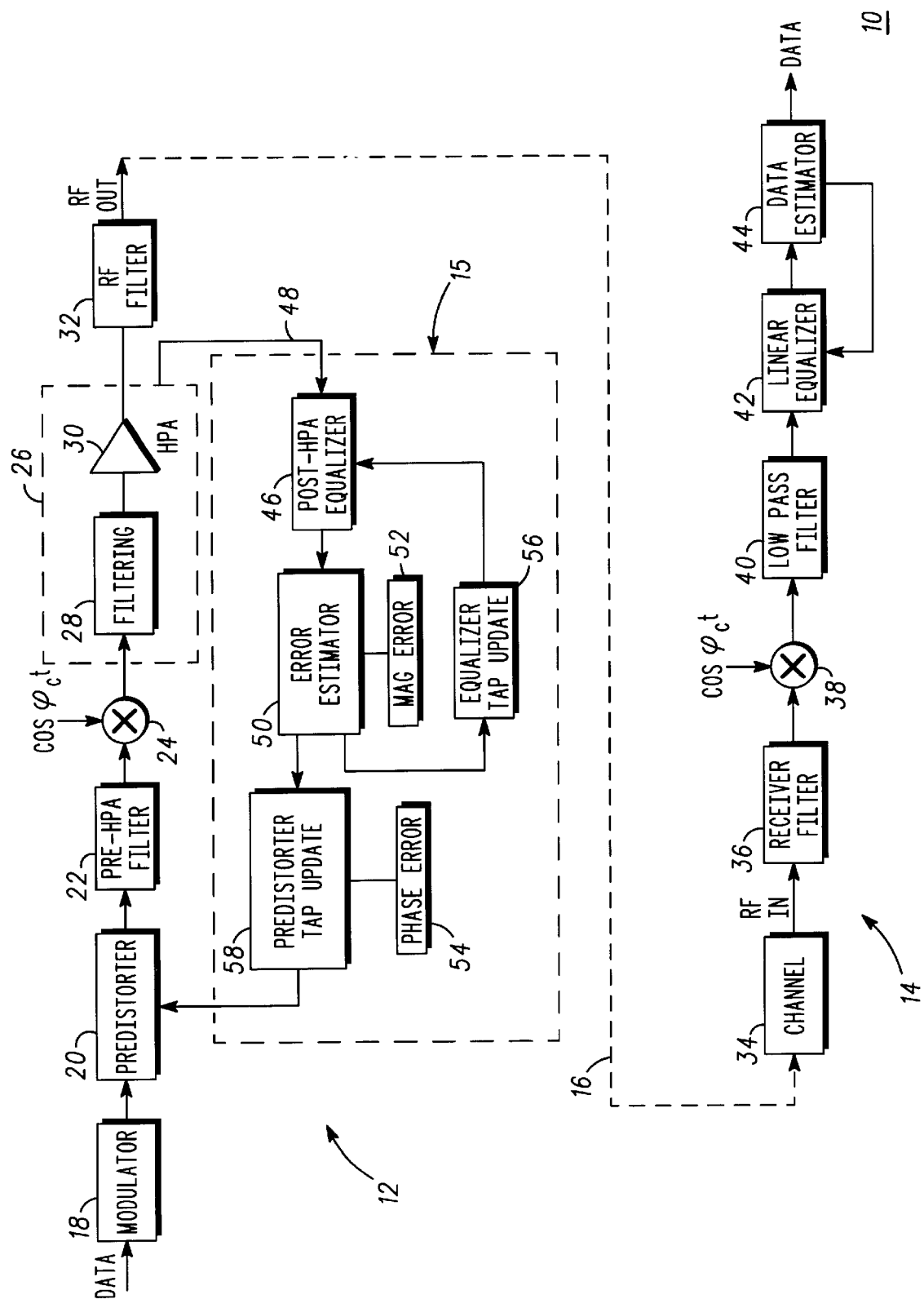

POST-AMPLIFIER FILTER REJECTION EQUALIZATION

This application is related to the following U.S. Patent Applications, which are assigned to the same assignee as the present invention, and which are incorporated herein by reference in their entirety: U.S. patent application Ser. No. 09/473,352 (IRI03914), filed on Dec. 28, 1999, entitled "MEMORYLESS NONLINEAR PREDISTORTION OF DIGITAL AMPLITUDE MODULATION"; U.S. patent application Ser. No. 09/473,174 (IRI03915), filed on Dec. 28, 1999, entitled "METHOD FOR LOCALLY ADAPTED FRACTIONALLY SPACED LINEAR PREDISTORTER"; and U.S. patent application Ser. No. 09/473,457 (IRI03916), filed on Dec. 28, 1999, entitled "LOCALLY ADAPTED PARALLEL T-SPACED LINEAR PREDISTORTER".

FIELD OF THE INVENTION

The present invention relates to a system and method for predistorting a signal prior to input to an amplifier in order to cancel out memory components introduced prior to input to the amplifier by a filtering effect and, more particularly, to equalization of a postamplifier signal for use only in the predistortion of transmitted signals.

BACKGROUND OF THE INVENTION

Transmitters used in high data rate communication links, such as in certain satellite communications systems typically employ high power amplifiers (HPAs), such as traveling wavetube amplifiers (TWTAs) and solid state power amplifiers (SSPAs),. These types of high speed communication systems typically need a relatively high output power so that the signal being transmitted can travel greater distances before being significantly attenuated. In these types of communication systems, a low frequency digital baseband signal comprising a stream of digital data bits is transmitted after modulation onto a high frequency carrier wave.

Different modulation schemes in the art distinguish the digital bits. Example digital modulation schemes for different applications include amplitude-shift keying (ASK), frequency-shift keying (FSK), binary phase-shift keying (BPSK), quadrature-phase shift keying (QPSK), and quadrature amplitude modulation (QAM). Also, the digital baseband signals may be multilevel (M-ary) signals requiring multilevel modulation methods. Quadrature modulation schemes provide both amplitude and phase modulation of the carrier because both complex and imaginary representations of the signal are used.

In quadrature modulation schemes, such as QAM, each bit is converted to a bit symbol representing a complex value having an in-phase (real) component and a quadrature-phase (imaginary) component. A constellation pattern represents a group of symbols positioned within a circle around the origin of an imaginary axis and a real axis. The distance from the origin represents the amount of power being transmitted. For example, a group of four bits transmitted at a particular time is represented as sixteen ($2^4$) symbols in the circle. Each symbol in the pattern identifies a complex voltage value having an in-phase component and a quadrature-phase component and represents the voltage value for a particular symbol period, which is the time during which each symbol is transmitted. The analog voltage value for each symbol is used to modulate a carrier wave. The symbols in the constellation pattern are geometrically spread so that they are equally spaced apart to more readily distinguish the symbols and reduce bit errors and may be positioned on one or more circles centered about the origin of the constellation pattern. Preferably, the constellation patterns get processed through the transmitter without being distorted so that the bits are readily distinguishable from each other at the receiver end.

High power amplifiers (HPAs) are desirable in high speed communication applications because they provide high gain over wide bandwidths. However, the input signals to a HPA must be controlled because the HPA exhibits non-linear transfer characteristics. At lower input powers, the output-input power relationship of the HPA is approximately linear. However, at peak power output, the HPA saturates and further increases in the input power beyond the saturation point actually decrease the output power of the amplifier.

The non-linearity of the HPA affects the position of the symbols in the constellation pattern by moving them away from the origin. Therefore, it is known to provide amplifier predistortion techniques in the transmitter when the amplifier is being operated in its non-linear range near peak output power. This predistortion approach typically includes using a memoryless mapping function that employs look-up tables that preset the constellation pattern symbols closer to the origin, so that when the signal passes through the amplifier, the symbols are moved towards locations representative of a linear transfer function.

High power amplifiers also include filtering distortions that cause the amplifier to have memory of previous constellation symbols already transmitted. The term "amplifier memory" refers to the effect that the transmission of one symbol or group of symbols has on the transmission of the following symbol or groups of bits. High gain amplifiers introduce AM/AM (amplitude modulation) and AM/PM (phase modulation) distortion as a result of the non-constant envelope nature of the signals that are provided as inputs to the amplifier. Because the data is digitally encoded on a waveform, the pulse shape of the waveform creates artifact portions, where preceding pulses combine to interfere with the particular pulse being sampled. This is known as intersymbol interference (ISI), and requires that the signal pulses be shaped to reduce the memory of the amplifier.

Multiple possible transmission paths of a signal through a transmitter exist for an input signal. A typical input signal into a HPA, such as a TWTA, undergoes a filtering effect by the transmitter hardware before the amplifier. The input signal also experiences filtering effects of the HPA as a result of its memory. Because the amplifier has memory, a symbol can follow different paths, depending on what symbols were transmitted before the current symbol period. The non-linearity of the amplifier distorts the filtered input signal due to its nonconstant envelope. By applying memory predistortion techniques, the ISI of the amplifier can be reduced, thus limiting the distortion.

Locally-adapted linear predistorters typically intend to invert the filtering prior to the HPA (pre-HPA filtering) and ignore filtering after the HPA (post-HPA filtering). The presence of filtering after the non-linearity of HPA will provide a linear signal at the receiver. The receiver equalizer typically suitably removes most filtering with minimal distortion so long as only linear distortion exists. However, post-HPA filtering complicates the linear predistortion by introducing non-linear, memory components to the signal. This non-linear memory interferes with the desired operation of the predistorter algorithm, thus, it is desirable to eliminate the post-HPA filtering to enhance the predistortion.

BRIEF DESCRIPTION OF THE DRAWING

The various advantages of the present invention will become apparent to one skilled in the art by reading the following specification and appended claims, and by referencing the following drawing in which:

FIG. 1 is a schematic block diagram of a transmitter and receiver system arranged in accordance with the principals of the present invention.

DETAILED DESCRIPTION OF THE INVENTION

FIG. 1 depicts a block diagram of a communication system 10 for exchanging modulated data signals between a transmitter 12 and a receiver 14 via a communication link 16, such as a air link or a hard-wired interconnection, arranged in accordance with the principles of the present invention. Transmitter 12 includes a modulator 18 which receives a digital data stream at baseband frequency. Modulator 18 modulates the data stream, utilizing a quadrature amplitude modulation (QAM) format, or other modulation format such as binary phase-shift keying (BPSK), differential phase-shift keying (DPSK), and quadrature phase-shift keying (QPSK), or other known M-ary PSK modulation formats. Modulator 18 modulates the bits onto an analog carrier wave. During modulation, modulator 18 identifies for each bit pattern a symbol that includes an in-phase and quadrature phase component, and maps the symbols into a constellation pattern for transmission. The modulated signal has an analog voltage for each symbol to be transmitted. The modulator 18 can be any suitable quadrature modulator for the purpose described herein, as will be apparent to those skilled in the art.

The modulated signal is input into a predistorter 20. Predistorter 20 is embodied, in a preferred embodiment, as a programmable filter, as will be described in greater detail herein. Predistorter 20 adds a predistortion signal to the modulated signal, which is an inverse of the distortion introduced by transmitter 12 and modeled as pre-HPA filter 22. The distortion signal is later cancelled by distortion intentionally introduced by other components of transmitter 12. Predistorter 20 may be embodied as a fractionally spaced predistorter which performs a plurality of calculations on each symbol so that intersymbol interference (ISI) is introduced at a plurality of locations during a given period. As will be discussed in more detail below, predistorter 20 receives voltage signals from predistorter update system 15 which receives the amplified signal that has been distorted by amplifier system 26.

Predistorter 20 is an inverse filter that changes the linear combination of various points in the constellation pattern by performing a weighted sum on the points to change the complex voltage value output by modulator 18. The predistorter 20 can be a linear finite impulse response (FIP) or infinite impulse response (IIP) filter. For example, predistorter 20 can employ a path delay-line digital filter to provide digital filtering. The weighted sum is based on the voltage of previous symbols that have already been transmitted. This inverse filtering adjustment predistorts the constellation pattern representing the complex signal so that when the distortion from amplifier system 26 occurs, the signal actually returns to desirable undistorted state for transmission. In this embodiment, predistorter 20 is positioned after modulator 18 and acts as an analog-type predistorter. However, as will be appreciated by those skilled in the art, predistorter 20 can be a digital predistorter. For example, modulator 18 can output digital symbols that have been modulated, where predistorter 20 operates on digital symbols and a digital-to-analog converter (not shown) after predistorter 20 can provide digital-to-analog conversion. Predistorter 20 outputs a predistorted, modulated signal which is shown as being input into a pre-HPA filter 22. Pre-HPA filter 22 merely represents the filtering effect of the physical circuitry in transmitter 12.

The radio frequency (RF) signal from modulator 18 and predistorted by predistorter 20 is at a baseband frequency and must be upconverted to a high frequency for transmission. A mixer 24 upconverts the baseband frequency with a high frequency signal, such as $\cos(T_c t)$. Mixer 24 converts the in-phase and quadrature-phase representations of the complex voltage from the modulation process to a single high frequency RF signal. The predistortion technique of the present invention can also be done at RF frequency, where predistorter 20 would be located after mixer 24. The upconverted RF signal is then applied to the amplifier system 26 that significantly increases the power for transmission. The operation of the mixing step and amplification step for a transmitter of this type is well understood to those skilled in the art.

The upconverted, amplified signal from amplifier system 26 has been distorted back to is desirable pattern and is applied to a RF filter 32 for subsequent RF filtering for conforming with Federal Communications Commission (FCC) requirements and then to an antenna (not shown) for transmission. The amplified signal from amplifier system 26 is also applied to an update system 15 from a test point 48, as will be described herein, following amplifier system 26. A suitable power coupler (not shown) would be provided at test point 48 to remove a small portion of the high power signal from amplifier system 26. Any type of suitable power splitter can be used to split the signal at test point 48 to send a portion of the signal to update system 15.

According to the invention, update system 15 continually provides a voltage signal to predistorter 20 to make adaptive changes to the arrangement of the constellation pattern to invert the filtering caused by amplifier system 26, which changes over time. It is necessary to continually test the amplified signal because it is not possible to measure the filtering generated by amplifier system 26.

Amplifier system 26 includes a high power amplifier (HPA) 30 and also includes a filter 28 which represents a memory filtering effect which is a natural by product of operation of amplifier system 26 and, in particular, HPA 30. HPA 30 may be embodied as a solid state power amplifier (SSPA) or a travelling wave tube amplifier (TWTA). In addition to the filtering effect represented by filter 28, HPA 30 also introduces a memoryless non-linearity into the RF signal output by amplifier system 26 and input to RF filter 32.

The signal output by RF filter 32 is broadcast across a channel 34 via communication link 16. The signal is received at receiver 14 by an antenna (not shown) that applies a signal to a receiver filter 36. The receiver filter 36 provides initial filtering of the received signal, for filtering channel noise and the like, and is typically closely matched to the transmitted signal. Receiver filter 36 rejects thermal noise and allows optimal reception. A mixer 38 downconverts the RF signal to an intermediate frequency signal by mixing the signal with a high frequency signal $\cos(T_c t)$. The downconverted signal from mixer 38 includes baseband in-phase and quadrature-phase components. The downconverted signal is applied to low-pass filter 40 to provide filtering at baseband frequencies. Thus, receiver filter 36 typically acts as a course filter, and low-pass filter 40 typically acts as a fine filter.

The filtered baseband signal from low-pass filter 40 is applied to a linear equalizer 42 that removes the ISI from transmission of the signal through channel 34. Receiver filter 36 and low-pass filter 40 may also generate the ISI. Linear equalizer 42 typically includes a tapped delay line filter, which is known in the art, where the taps are adjusted by a data estimator 44. Data estimator 44 takes the voltage represented by the in-phase and quadrature-phase values and converts it back to bits. Data estimator 44 can use any suitable algorithm to perform this function, such as a known zero-forcing algorithm. Data estimator 44 measures the symbol locations, and generates an estimate between the actual symbol locations and the desired symbol locations. Thus data estimator 44 provides an error correction between the constellation pattern actually received versus the expected constellation pattern. The equalizer update signal sent from data estimator 44 to linear equalizer 42 provides a filter correction to achieve the desired constellation pattern based on the error of calculation. With particular interest to the present invention, transmitter 12 includes an update system 15. The low power signal at test point 48 is input to post-HPA equalizer 46. Post-HPA equalizer 46 functions as an analytic equalizer for the primary purpose of providing a signal for generating predistorter tap weights. This allows for a significantly lower processing rate because the HPA output will have virtually no time-varying responses. In a preferred embodiment, post-HPA equalizer 46 samples data in a burst fashion at test point 48 at intervals which are less than continuous so that such sampling does not significantly reduce the speed of transmitter 12. A continuous sample approach may also be used.

The post-HPA equalizer 46 and pre-HPA predistorer 20 are adaptive systems. The taps for predistorter 20 are adaptively driven to cause the predistorter 20 to invert the filtering in the system prior to the non-linearity in the HPA 30 while the taps for the equalizer are adapted to cause the post-HPA equalizer 46 to invert the memory after this non-linearity. The filtering or memory in the system can be physically located internal to the HPA 30 or it can be in various parts of the overall system. When both post-HPA equalizer 46 and predistorter 20 are fully adapted to the final solution, the predistorter 20 effectively inverts the memory prior to the non-linearity in the HPA 30 and the post-HPA equalizer 46 inverts the memory after the non-linearity.

In the present invention, the memory of the system is decomposed into two linear parts separated by a memoryless non-linear element. Linear memory or filtering effects can be inverted by linear processing elements by known methods to those skilled in the art. However, inversion of the non-linear memory if taken as a whole is a much harder problem to solve and requires non-linear processing with memory. If the linear predistorter algorithm were operated without the equalizer and related method taught by this invention, then the predistorter would respond to the complete memory of the system.

The linear predistorter correction element that is only capable of inverting the linear memory prior to the non-linearity by the algorithms would see the memory after the non-linearity. Without the post-HPA equalizer 46 of the present invention, the taps generated by the algorithm would not completely invert the memory prior to the non-linearity because of the linear restrictions of the predistorter 20, but would try to invert the complete memory of the system. The optimum solution for such a linear predistorter 20 is to completely invert the memory it is capable of inverting, and this memory is the memory prior to the non-linearity. By allowing predistorter 20 to respond to the memory after the non-linearity, the predistorter arrives at a sub-optimum solution. The present invention addresses this problem.

The equalizer 46 taught by this invention inverts the memory after the non-linearity and causes the predistorter algorithm to see only the memory prior to the non-linearity. In this sense, the predistorter would operate like it was in a system that did not have any filtering after the non-linearity. Similarly, the predistorter 20 in its adapted state inverts the memory prior to the non-linearity and causes the equalizer to adapt substantially as it would if it were placed in a system that did not have any memory prior to the non-linearity. The decoupling of these two correction elements represents a significant improvement over the prior art because either element placed in the system alone would see the memory of the system on the other side of the non-linearity and would respond to this memory thereby providing a suboptimial solution. It is only when both are operated together that the desired solution for each element is achieved.

When operated together, the post-HPA equalizer 46 and the predistorter 20 adapt such that the memory of the system is eliminated. This result is reached by decomposing the error term normally used in an equalizer update algorithm into a magnitude and phase component. This decomposition effectively decouples the two algorithms such that when operated together, the desired tap solutions are generated.

Error estimator 50 compares the equalized signal received from post-HPA equalizer 46 to an expected signal which represents the output from pre-HPA filter 22. Error estimator 50 outputs a magnitude error 52 and a phase error 54. The magnitude error is input to equalizer tap update block 56. Equalizer tap update block 56 correlates the error to the data and outputs a tap update signal to post-HPA equalizer 46. Similarly, error estimator 50 outputs a phase error 54 to predistorter tap update block 58. Predistorter tap update block 58 is embodied as an analog tap delay filter and as such may have bandlimiting. Because the bandlimiting is seen by the algorithm, this bandlimiting would be corrected, and this is a self-correcting feature of the invention. Predistorter tap update block 58 outputs a tap signal to predistorter 20 in order to vary the predistortion introduced by predistorter 20.

From the foregoing, one skilled in the art will recognize that the communication system 10 provides a novel method for equalization of the post-HPA test point signal for use only in predistortion of transmitted signals. This configuration isolates the predistortion section from post-HPA filtering, which is best removed by receiver-based equalizer algorithms. Further, cancellation of the post-HPA filtering occurs only in the feedback path provided by the post-HPA equalizer. Further yet, such equalization is performed locally at the transmitter and does not involve the receiver 14.

While specific embodiments have been shown and described in detail to illustrate the principles of the present invention, it will be understood that the invention may be embodied otherwise without departing from such principles. For example, one skilled in the art will readily recognize from such discussion and from the accompanying drawings and claims that various changes, modifications and variations can be made therein without departing from the spirit and scope of the invention as described in the following claims.

What is claimed is:

1. A communication system comprising:
   a modulator for modulating a data stream onto a carrier wave to generate a modulated signal, the modulator converting data on the data stream into symbols for transmission by the transmission system;
   an amplifier for amplifying the modulated signal prior to transmission to generate an amplified signal, the amplifier including an amplifier filtering effect the distorts the modulated signal, wherein the modulated signal is also distorted by a pre-amplifier filtering effect;

a predistorter, the predistorter receiving the modulated signal prior to amplification by the amplifier, the predistorter generating an inverse signal of the pre-amplifier filtering effect, the inverse signal varying the modulated signal to define a predistorted signal;

an equalizer receiving a portion of the amplified signal, the equalizer removing he amplifier filtering effect and generating a equalized signal, the equalized signal being operable to vary generation of the inverse signals;

an error estimator, the error estimator receiving the equalized signal and estimating a difference between the equalized signal and the modulated signal, defined as an error signal, the error signal having a phase error component and a magnitude error component;

a predistorter tap update generator, the predistorter tap update generator generating a first signal for controlling operation of the predistorter in accordance with the phase error component output by the error estimator; and an equalizer tap update generator, the equalizer tap update generator generating a second signal for controlling operation of the equalizer in accordance with the magnitude error component output by the error estimator.

2. The communication system of claim 1 wherein the equalizer samples the amplified signal at predetermined intervals, the predetermined intervals being defined as less than continuous.

3. The communication system of claim 1 wherein the equalizer samples the amplified signal at predetermined intervals, the predetermined intervals being defined as less than continuous.

4. The communication system of claim 1 wherein the amplifier is one of a traveling wave tube amplifier (TWTA) or a solid state power amplifier (SSPA).

5. A method for a transmission of data comprising the steps of:

modulating a digital data stream onto a carrier wave to generate a modulated signal, wherein modulating the stream of digital data includes the step of converting the digital data stream into symbols for transmission;

amplifying the modulated signal prior to transmission to generate an amplified signal, the step of amplifying introducing an amplifying filtering effect that distorts the modulated signal, wherein the modulated signal is also distorted by a pre-amplifier filtering effect occurring prior to the step of amplifying;

predistorting the modulated signal prior to amplifying the modulated signal, the step of predistorting including generating an inverse of the pre-amplifier filtering effect, the inverse varying the modulated signal to define a predistorted signal;

equalizing a portion of the amplified signal by removing the amplifying filtering effect and generating an equalized signal, the equalized signal being operable to vary generation of the inverse of the pre-amplifier filtering effect;

estimating an error between the equalized signal and the modulated signal, the error having phase error and magnitude error components;

generating a first signal for controlling the step of predistorting in accordance with the phase error component; and generating a second signal for controlling the step equalizing in accordance with the phase error component.

6. The method of claim 5 wherein the step of equalizing further comprises sampling the amplified signal at predetermined intervals, the predetermined intervals being defined as less than continuous.

7. The method of claim 5 wherein the step of equalizing further comprises sampling a portion of the amplified signal at predetermined intervals, the predetermined intervals being defined as less than continuous.

8. A communication system comprising:

a modulator for modulating a digital data stream onto a carrier wave to generate a modulated signal, the modulator converting data on the data steam into symbols for transmission by the transmission system;

a high power amplifier (HPA) for amplifying the modulated signal prior to transmission to generate an amplified signal, the HPA including an HPA filtering effect that distorts the modulated signal, wherein the modulated signal is also distorted by a pre-HPA filtering effect prior to amplification by the HPA;

a predistorter, the predistorter receiving the modulated signal prior to amplification by the HPA, the predistorter generating an inverse signal of the pre-HPA filtering effect, the inverse signal varying the modulated signal to define a predistorted signal;

an equalizer receiving a portion of the amplified signal, the equalizer removing the HPA filtering effect and generating an equalized signal, the equalized signal being operable to vary generation of the inverse signal of the pre-HPA filtering effect;

an error estimator, the error estimator receiving the equalized signal and estimating an error signal defined as a difference between the equalized signal and the modulated signal, the error signal having a phase error component and a magnitude error component;

a predistorter tap update generator, the predistorter tap update generator generating a first signal for controlling operation of the predistorter in accordance with the phase error component; and an equalizer tap update generator, the equalizer tap update generator generating a second signal for controlling operation of the equalizer in accordance with the magnitude error component, wherein the equalizer samples the amplifier output signal at predetermined intervals, the predetermined intervals being defined as less than continuous.

* * * * *

UNITED STATES PATENT AND TRADEMARK OFFICE
CERTIFICATE OF CORRECTION

PATENT NO. : 6,674,808 B1
DATED : January 6, 2004
INVENTOR(S) : Richard S. Griph It is certified that error appears in the above-identified patent and that said Letters Patent is hereby corrected as shown below:

<u>Column 4,</u>
Line 42, delete "by product" and insert -- byproduct --

Signed and Sealed this

Twenty-fourth Day of February, 2004

JON W. DUDAS
*Acting Director of the United States Patent and Trademark Office*